(12) United States Patent
Kim et al.

(10) Patent No.: US 8,360,593 B2
(45) Date of Patent: Jan. 29, 2013

(54) LED PACKAGE AND BACK LIGHT UNIT USING THE SAME

(75) Inventors: Tae Kwang Kim, Ansan-si (KR); Chung Hoon Lee, Ansan-si (KR); Do Hyung Kim, Ansan-si (KR); Seung Ryeol Ryu, Ansan-si (KR); Chan Sung Jeong, Ansan-si (KR); Woong Joon Hwang, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 268 days.

(21) Appl. No.: 12/680,097

(22) PCT Filed: Sep. 19, 2008

(86) PCT No.: PCT/KR2008/005544
§ 371 (c)(1),
(2), (4) Date: Mar. 25, 2010

(87) PCT Pub. No.: WO2009/041767
PCT Pub. Date: Apr. 2, 2009

(65) Prior Publication Data
US 2010/0202131 A1    Aug. 12, 2010

(30) Foreign Application Priority Data

Sep. 28, 2007 (KR) .................. 10-2007-0098343
Dec. 31, 2007 (KR) .................. 10-2007-0141377

(51) Int. Cl.
*H01L 33/00* (2010.01)

(52) U.S. Cl. .................. 362/97.3; 362/311.02; 257/98; 257/99; 257/100

(58) Field of Classification Search .................... 257/98, 257/100, 99; 362/97.3, 612, 311.02
See application file for complete search history.

(56) References Cited

U.S. PATENT DOCUMENTS

| | | | |
|---|---|---|---|
| 6,653,661 B2 | 11/2003 | Okazaki | |
| 6,869,813 B2 * | 3/2005 | Okazaki | 438/22 |
| 7,282,748 B2 * | 10/2007 | Takeda et al. | 257/98 |
| 7,352,011 B2 * | 4/2008 | Smits et al. | 257/99 |
| 7,458,703 B2 * | 12/2008 | Han et al. | 362/267 |
| 8,030,762 B2 * | 10/2011 | Lee et al. | 257/717 |
| 8,076,680 B2 * | 12/2011 | Lee et al. | 257/88 |

(Continued)

FOREIGN PATENT DOCUMENTS

| | | |
|---|---|---|
| JP | 09-96705 | 4/1997 |
| JP | 2004-259958 | 9/2004 |

(Continued)

OTHER PUBLICATIONS

Written Opinion and International Search Report mailed Apr. 6, 2009 in International Application No. PCT/KR2008/005544.

(Continued)

*Primary Examiner* — Robert May
(74) *Attorney, Agent, or Firm* — H.C. Park & Associates, PLC (57) ABSTRACT

Disclosed is a light emitting diode (LED) package. The LED package comprises a package body having a cavity and a stepped portion positioned on a top portion of the cavity; an LED chip mounted on a bottom surface of the cavity; an encapsulant formed in the cavity to cover the LED chip; and a lens having a pattern and attached to the stepped portion on the encapsulant.

11 Claims, 5 Drawing Sheets

U.S. PATENT DOCUMENTS

| | | |
|---|---|---|
| 2006/0102914 A1 | 5/2006 | Smits et al. |
| 2007/0019416 A1 | 1/2007 | Han et al. |

FOREIGN PATENT DOCUMENTS

| | | |
|---|---|---|
| JP | 2007-123939 | 5/2007 |
| JP | 2007-165464 | 6/2007 |
| KR | 10-2007-0099733 | 10/2007 |
| WO | 2006/022516 | 3/2006 |
| WO | WO 2007074983 A1 * | 7/2007 |

OTHER PUBLICATIONS

Taiwan Preliminary Notice of First Office Action dated Mar. 21, 2012 for Patent Application No. 097137205.

* cited by examiner

LED PACKAGE AND BACK LIGHT UNIT USING THE SAME

CROSS-REFERENCE TO RELATED APPLICATIONS

This application is the National Stage of International Application No. PCT/KR2008/005544, filed Sep. 19, 2008, and claims priority from and the benefit of Korean Patent Application No. 10-2007-0098343, filed on Sep. 28, 2007, and Korean Patent Application No. 10-2007-0141377, filed on Dec. 31, 2007, which are all hereby incorporated by reference for all purposes as if fully set forth herein.

BACKGROUND OF THE INVENTION

1. Field of the Invention

The present invention relates to a light emitting diode (LED) package, and more particularly, to a side view LED package having an elongated cavity.

2. Discussion of the Background

LED packages are formed by mounting an LED chip to various types of packages depending on use. Particularly, a side view LED package is mainly used as a display backlight source, and is disposed at a side of a light guide plate to provide light in parallel with the light guide plate.

Figure 1:
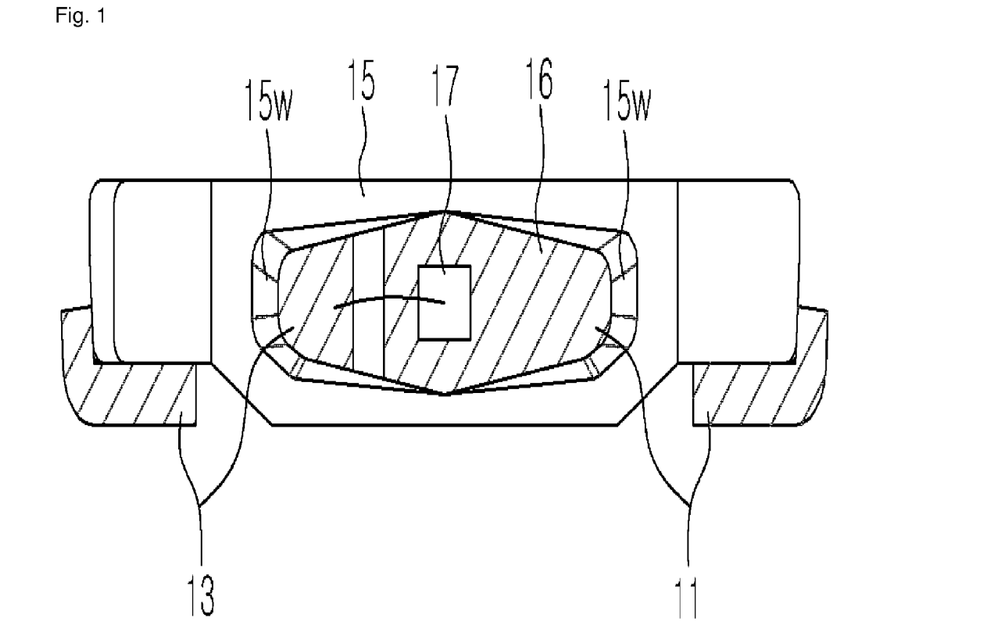
FIG. 1 is a plan view illustrating a conventional side view LED package.
Figure 2:
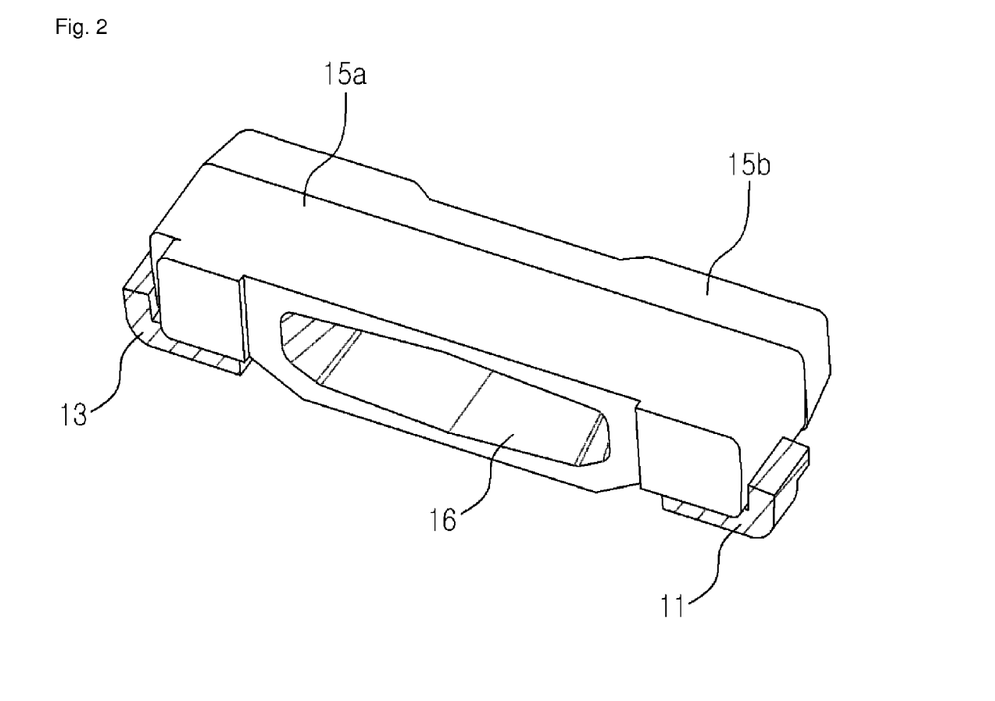
FIG. 2 is a perspective view illustrating the conventional side view LED package.

FIGS. 1 and 2 are plan and perspective views of a conventional side view LED package, respectively.

Referring to FIGS. 1 and 2, the LED package comprises a pair of lead terminals, i.e., first and second lead terminals 11 and 13. The first and second lead terminals 11 and 13 are supported by a package body 15. The package body 15 may be formed by insert-molding with the lead terminals inserted therein.

For convenience of illustration, the package body 15 may be divided into upper and lower package bodies 15a and 15b based on a position of the first and second lead terminals 11 and 13.

The upper package body 15a has an elongated cavity 16 which allows the first and second lead terminals 11 and 13 to be exposed. The first and second lead terminals 11 and 13 are positioned on the bottom surface of the cavity 16, i.e., on the lower package body 15b, and are spaced apart from each other within the cavity 16. Further, the respective first and second lead terminals 11 and 13 protrude outwardly from the package body 15 so as to be electrically connected to an external power source. The outwardly protruding portions of lead terminals 11 and 13 may have a variety of shapes or be bent into various shapes. FIGS. 1 and 2 illustrate the lead terminals 11 and 13, which are bent from a lower surface of the package body 15 to a side surface thereof.

An LED chip 17 is mounted on the first lead terminal 11 in the cavity 16 and electrically connected thereto and is electrically connected to the second lead terminal 13 through a bonding wire. The cavity 16 may be filled with an encapsulant made of a transparent resin, and phosphors may be incorporated in the transparent resin.

The conventional side view LED package comprises the elongated cavity 16, and its inner sidewalls, particularly its inner sidewalls 15w positioned in a major axis direction, are slantingly formed, thereby increasing a viewing angle along the major axis direction. Such a side view LED package is suitable for a backlight source for a display, which is disposed at a side of a light guide plate, and white light can be emitted from the side view LED package by properly selecting the LED chip 17 and phosphors.

However, in the conventional side view LED package, it is limited to adjust an orientation angle of light emitted from the LED chip 17, and it is difficult to control the properties of light, including an orientation angle and the like, only by the limited shape of the cavity and encapsulant filled therein. Therefore, it is required to make continuous attempts to control the properties of light, including an orientation angle and the like, in the side view LED package. Further, the conventional side view LED package is inefficient because a large number of LED packages are required to supply light parallel with a light guide plate.

In addition to the side view LED package, another type of LED package, e.g., a top view LED package, also has a limit in adjusting an orientation angle of light emitted from an LED chip. Therefore, it is required to adjust an orientation angle having a predetermined direction and angle size for obtaining a desired light efficiency.

Particularly, when a plurality of LED packages are used as a light source of a backlight unit, the light emitted from each LED package is necessarily emitted to have a wide orientation angle in order to obtain a uniform backlight. However, a conventional side view LED package does not provide a uniform light in a backlight unit since it is difficult to control an orientation angle.

Accordingly, a technique for mounting a patterned lens on an upper surface of a package body of an LED package has been proposed to adjust an orientation angle and the like. However, such a technique is easily applied to a top view LED package having a circular cavity, but it is difficult to apply the technique to an LED package having a small thickness and an elongated and narrow cavity, such as a side view LED package. In addition, when a lens is mounted on an upper surface of a body of an LED package, the entire size of an optical system is increased and light loss results from the increase of the distance of a path through which light emits to the outside via an encapsulant and the lens.

SUMMARY OF THE INVENTION

Accordingly, an object of the present invention is to provide an LED package capable of preventing its enlargement caused by installation of a lens having a pattern and an increase of the distance of a light emitting path by allowing at least a portion, preferably the whole, of the patterned lens to be disposed in a cavity.

According to an aspect of the present invention, there is provided an LED package, which comprises a package body having a cavity and a stepped portion positioned on a top portion of the cavity; an LED chip mounted on a bottom surface of the cavity; an encapsulant formed in the cavity to cover the LED chip; and a lens having a pattern and attached to the stepped portion on the encapsulant.

Preferably, a top surface of the encapsulant is positioned on the same plane as the stepped portion, or is positioned lower than the stepped portion.

Preferably, an adhesive is formed on a surface of the stepped portion.

Preferably, an adhesive is formed between the lens and the encapsulant.

According to an embodiment of the present invention, the pattern formed on the lens may be a Fresnel pattern.

According to another embodiment of the present invention, the pattern formed on the lens may be a pyramid pattern. At this time, the pyramid pattern may be formed by a matrix arrangement of quadrangular pyramids, each of which has the same four isosceles triangular faces.

Preferably, a phosphor is contained in the lens.

Preferably, a bottom surface of the lens is a light incident surface in contact with the encapsulant, and a top surface of the lens is a light exit surface on which the pattern is formed.

Preferably, the cavity is defined by its inner sidewalls and its bottom surface, and the stepped portion is formed on only a pair of the inner sidewalls opposite to each other.

More preferably, the cavity has an elongated shape with major and minor axes, and the pair of inner sidewalls are parallel with the minor axis.

Preferably, a top surface of the lens is positioned at the same level as a top surface of the package body, or is positioned lower than the top surface of the package body.

According to another aspect of the present invention, there is provided a backlight unit using a plurality of side view LED packages. Each of the plurality of LED packages provided in the backlight unit comprises a package body having a cavity and a stepped portion positioned on a top portion of the cavity; an LED chip mounted on a bottom surface of the cavity; an encapsulant filled in the cavity to cover the LED chip; and a lens attached to the stepped portion on the encapsulant and formed with a pattern for adjusting an orientation angle of light emitted from the LED chip.

According to embodiments of the present invention, a lens having a pattern is attached on an encapsulant, thereby controlling emission properties of light, such as an orientation angle of light. When at least a portion of the lens is positioned in a cavity, it is possible to somewhat suppress the enlargement caused by installation of a lens and an increase of the distance of a light emitting path. Particularly, when the entire of the lens is positioned in the cavity, a compact LED package can be implemented, and the distance of a light emitting path is not substantially increased. Further, when a stepped portion having a lens attached thereon is formed only on sidewalls opposite to each other in a cavity, particularly sidewalls positioned on a major axis of a side view LED package (or sidewalls parallel with a minor axis), it is possible to suppress reduction of the cavity and/or increase of the thickness of the LED package caused by the stepped portion. According to an embodiment of the present invention, the increase of the thickness of the side view LED can be maximally suppressed.

DETAILED DESCRIPTION OF THE ILLUSTRATED EMBODIMENTS

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be implemented in other forms. In the drawings, the widths, lengths, thicknesses and the like of elements may be exaggerated for convenience of illustration. Like reference numerals indicate like elements throughout the specification and drawings.

Figure 3:
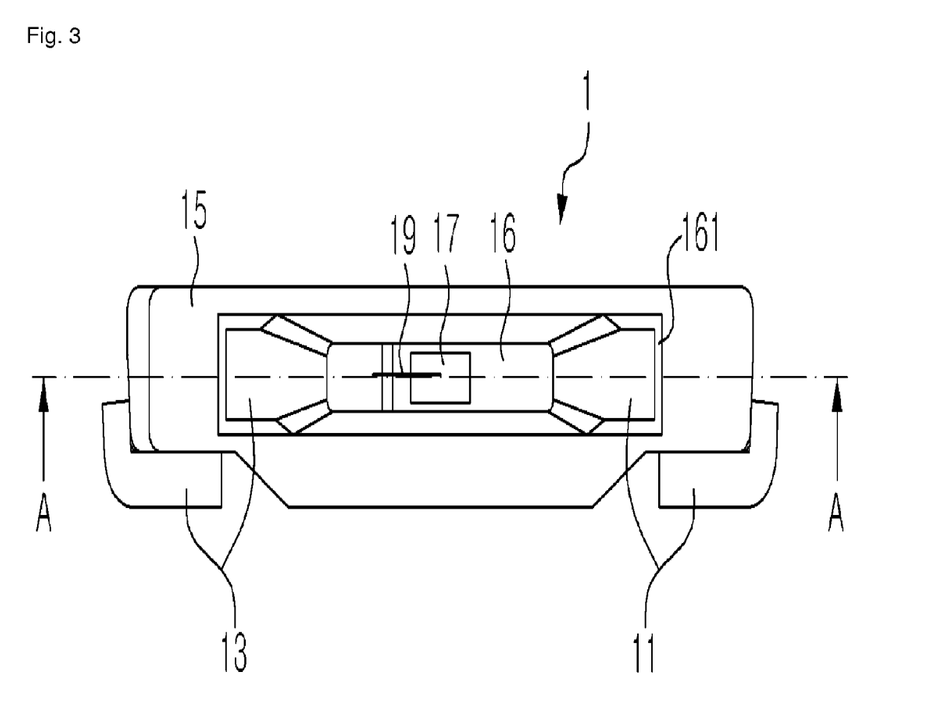
FIG. 3 is a plan view illustrating a side view LED package according to an embodiment of the present invention.
Figure 4:
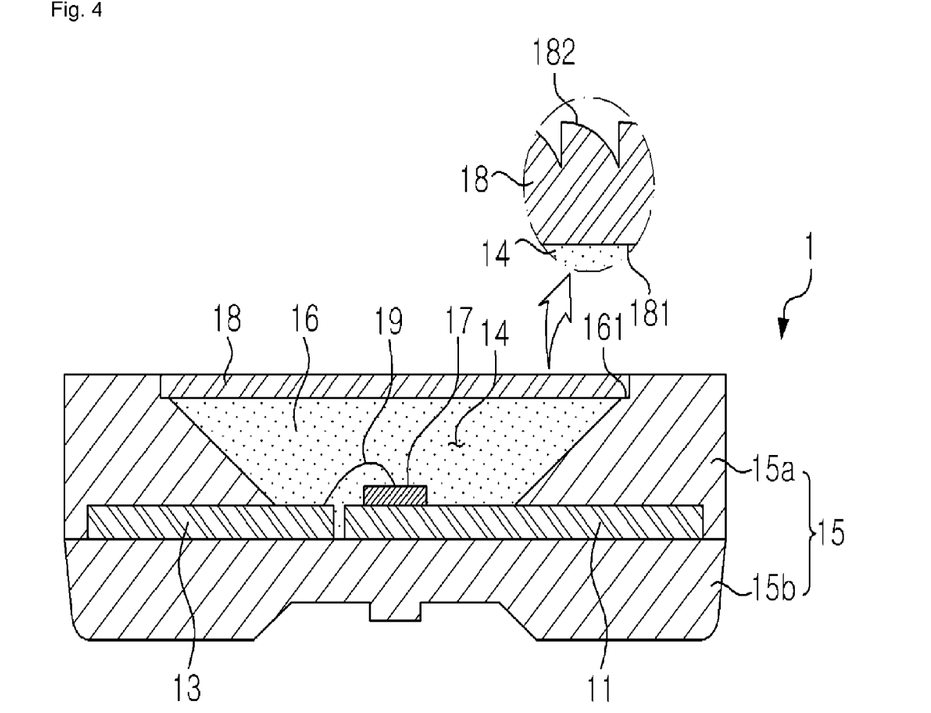
FIG. 4 is a sectional view taken along line A-A of FIG. 3.

FIG. 3 is a plan view illustrating a side view LED package according to an embodiment of the present invention, and FIG. 4 is a sectional view taken along line A-A of FIG. 3. In FIG. 3, an encapsulant and a lens, which are formed in the inside of a cavity, are omitted such that the inside of the cavity can be seen. In FIG. 4, the encapsulant and the lens can be seen.

Referring to FIGS. 3 and 4, a side view LED package 1 according to the embodiment of the present invention comprises a pair of lead terminals, i.e. first and second lead terminals 11 and 13. The first and second lead terminals 11 and 13 are supported by a package body 15. The package body 15 may be formed by insert-molding with the lead terminals 11 and 13 inserted therein. The package body 15 may be divided into an upper package body 15a and a lower package body 15b based on a position of the first and second lead terminals 11 and 13.

The upper package body 15a has a cavity 16 which allows the first and second lead terminals 11 and 13 to be exposed, and a mounting region of an LED chip 17 is exposed by the cavity 16. A stepped portion 161 having a lens 18 positioned thereon is formed on a top portion of the cavity 16. The first and second lead terminals 11 and 13 are formed on the bottom surface of the cavity 16, i.e. on the lower package body 15b, and are spaced apart from each other in the cavity 16. Further, the respective first and second lead terminals 11 and 13 protrude outwardly from the package body 15 such that they are electrically connected to an external power source. The outwardly protruding lead terminals 11 and 13 may have a variety of shapes or be bent into various shapes. Here, it is illustrated that the lead terminals 11 and 13 are bent from a lower surface of the package body 15 to a side surface thereof for surface mounting. The lead terminals 11 and 13 may be variously bent.

The LED 17 is mounted within the cavity 16 and is electrically connected to the first and second lead terminals 11 and 13. As shown in the figure, the LED chip 17 is mounted on the first lead terminal 11 on the bottom surface of the cavity, and is electrically connected to the second lead terminal 13 on the bottom surface of the cavity through a bonding wire 19. However, when an LED chip has two electrodes on the top surface thereof, the LED chip is not mounted on a predetermined one of the two lead terminals, but may be electrically connected to the two lead terminals through bonding wires, respectively.

The cavity 16 may be filled with an encapsulant 14, e.g., epoxy or silicon resin, to cover the LED chip 17. Phosphors for converting a wavelength of light emitted from the LED chip 17 may be contained in the encapsulant 14. A phosphor for partially converting light emitted from the LED chip 17, e.g., blue light, into yellow light may be contained in the encapsulant 14. Accordingly, a side view LED package for emitting white light can be provided.

Figure 5:
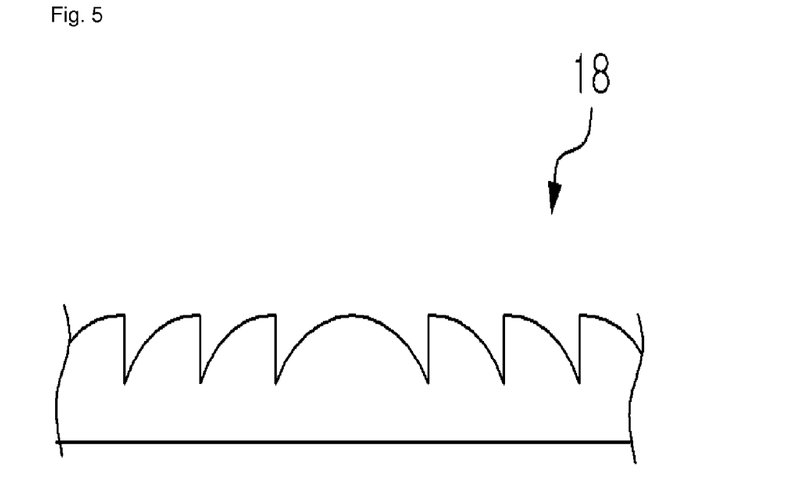
FIG. 5 is a sectional view illustrating a lens of FIG. 4.

The encapsulant 14 is positioned on the same plane as the stepped portion 161 provided on the top portion of the cavity 16, or is positioned below the stepped portion 161. As shown in FIG. 4, the lens 18 is disposed on top of the encapsulant 14 for covering the LED chip 17. The bottom surface of the lens 18 becomes a light incident surface 181, which is partially in contact with the encapsulant 14, and the top surface of the lens 18 becomes a light exit surface 182 on which a Fresnel pattern for adjusting an orientation angle is formed. A refractive index is controlled by a plurality of convex surfaces of the Fresnel pattern, so that the orientation angle of light can be variously adjusted. Particularly, a portion of the cross section of the Fresnel pattern is formed in a saw-toothed shape as shown in FIG. 5, the refractive index can be controlled by adjusting the slope of the saw-toothed shape. Although a Fresnel pattern having about three saw-toothed convex surfaces formed thereon has been shown in FIG. 5, it is not limited to the number of convex surfaces. Preferably, the number of convex surfaces is properly adjusted, considering easiness in manufacturing the Fresnel pattern.

In addition, it is preferable that the entire lens 18 be positioned inside of the cavity 16 including the stepped portion 161 in a state where the lens 18 adheres to the stepped portion. In this case, the top surface of the lens 18 is positioned at the same level as the top surface of the package body 15, or is positioned lower than the top surface of the package body 15. If the lens 18 does not protrude from the top surface of the package body 15, it is possible to prevent an unnecessary increase of the size of the LED package and an unnecessary increase of the length of a path of light in the LED package even though the lens is additionally mounted.

In this embodiment, the lens 18 has a convex lens shape in the center thereof, and the lens 18 is bilaterally symmetric with respect to the convex lens shape as shown in FIG. 5. The lens 18 having such a shape has a height lower than that of a general convex lens, so that the volume of the side view LED package can be reduced and the same luminance as the conventional convex lens can be maintained.

Meanwhile, the lens 18 is disposed to be in contact with the stepped portion 161 provided on the top portion of the cavity 16. Further, the lens 18 may adhere to the stepped portion 161 by an adhesive formed on a surface of the stepped portion 161. Although it has been described in this embodiment that the lens 18 adheres to the stepped portion 161 by the adhesive formed on the surface of the stepped portion 161, the present invention is not limited thereto. That is, the lens 18 may adhere thereto by an adhesive, e.g., a transparent adhesive, provided between the encapsulant 14 and the lens 18. Most preferably, an adhesive is interposed both between the lens and the stepped portion and between the lens and the encapsulant.

According to the embodiment of the present invention, the orientation angle of the side view LED package can be adjusted using the Fresnel lens formed on the encapsulant 14, and the light efficiency can be improved. Further, it is possible to maximally suppress an increase of the thickness of the side view LED.

The side view LED package having the aforementioned configuration may be applied to a backlight unit together with a plurality of other side view packages. For example, the side view LED packages are adjacent to a side of a light guide plate to allow light to be incident on the side of the light guide plate. The incident light is mixed in the light guide plate and then emitted in the form of a surface light source through the top surface of the light guide plate. Then, the emitted light can illuminate an illumination object such as an LCD panel.

Figure 6:
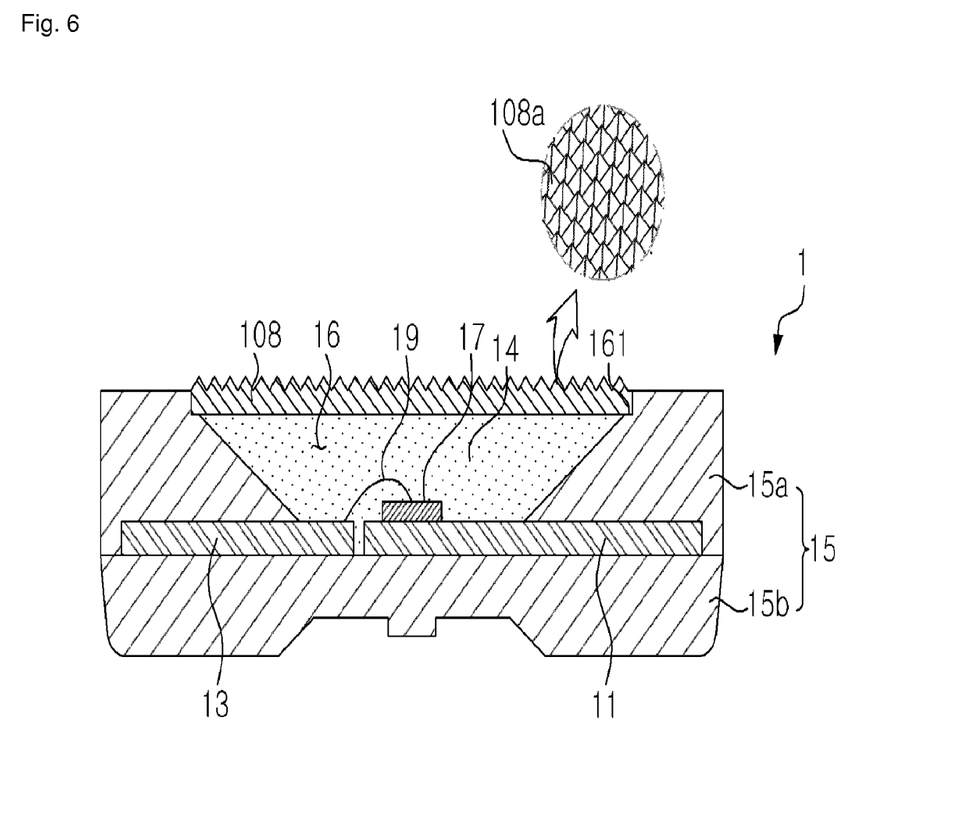
FIG. 6 is a sectional view illustrating an LED package according to another embodiment of the present invention.

FIG. 6 is a view illustrating an LED package according to another embodiment of the present invention. In FIG. 6, descriptions of the same components as those in the previous embodiment will be omitted, and like reference numerals indicate like elements.

Referring to FIG. 6, an LED package 1 of this embodiment comprises a lens 108 adhering to a stepped portion 161 provided on the top portion of a cavity 16 on an encapsulant 14, like the LED package in the previous embodiment. At this time, the lens 108 is a prism lens having a pyramid pattern.

When the top surface, i.e., light exit surface of the encapsulant 14 is plane, the prism lens 108 removes total internal reflection on the light exit surface, thereby increasing an extracted amount of light. As shown in an enlarged perspective view of a circle in FIG. 6, the pyramid pattern is formed by a matrix arrangement of quadrangular pyramids 108a, each of which has the same four isosceles triangular faces. More preferably, the quadrangular pyramid 108a has the same four equilateral triangular faces. Light can be emitted in the form of a surface light source roughly close to a regular square (or rectangular) shape by allowing the light to pass through the pyramid pattern formed by the matrix arrangement of the quadrangular pyramids 108a.

The LED package having the prism lens 108 may be applied to an edge-type backlight unit, which is disposed at a side of a light guide plate, or a direct-type backlight unit, which is disposed under a diffuser. When the LED package is applied to a direct-type backlight unit, the prism lens 108 partially functions as a prism sheet. Therefore, a prism sheet employed in a conventional direct-type backlight unit may also be omitted.

Figure 7:
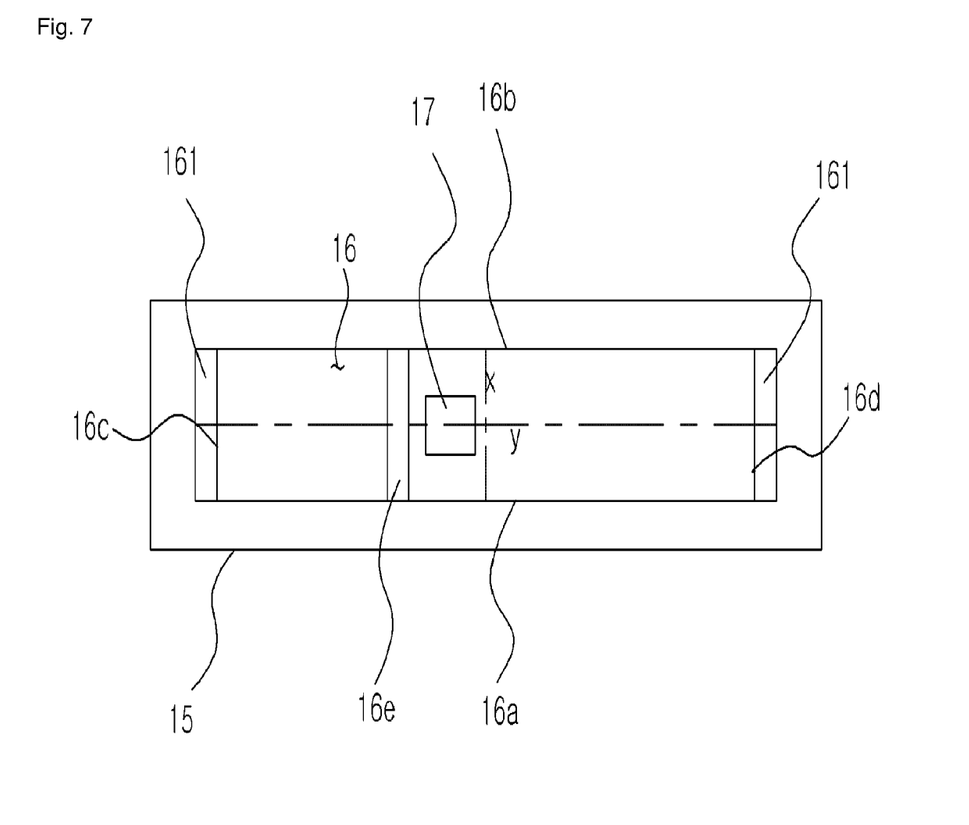
FIG. 7 is a view illustrating a position of a stepped portion in a cavity of an LED package according to an optimal embodiment of the present invention.

FIG. 7 is a view illustrating the most preferable positional relationship between a cavity and a stepped portion in a side view LED package.

Referring to FIG. 7, the side view LED package comprises a package body 15, and a cavity 16 defined by a bottom surface 16e, on which an LED chip 17 is mounted, and inner sidewalls 16a, 16b, 16c and 16d. At this time, the stepped portion is formed on only the pair of inner sidewalls 16c and 16d opposite to each other. Particularly, in the side view LED package including an elongated cavity having a major axis (y) and a minor axis (x), the stepped portion is formed on only the pair of inner sidewalls 16c and 16d parallel with the minor axis (x), so that reduction of the cavity due to the stepped portion is not required. Further, an increase of the thickness of the side view LED package is also not required.

The present invention may be particularly preferably used in a backlight unit of a light receiving type display such as an LCD, and may be applied to other various uses.

The invention claimed is:

1. A light emitting diode (LED) package, comprising:
   a package body comprising a cavity and a stepped portion extending from a top surface of the package body and into the cavity;
   an LED chip disposed on a bottom surface of the cavity;
   an encapsulant disposed in the cavity and covering the LED chip; and
   a lens comprising a pattern and being disposed on the stepped portion and the encapsulant,
   wherein a top surface of the lens is disposed coplanar with or below the top surface of the package body, and
   wherein the cavity comprises a first pair of opposing inner side walls, a second pair of opposing inner side walls, and the bottom surface, and wherein the stepped portion is formed on the first pair of opposing inner side walls, and the stepped portion is at least partially omitted from the second pair of opposing inner side walls.

2. The LED package of claim 1, wherein a top surface of the encapsulant is positioned on the same plane as the stepped portion or is positioned lower than the stepped portion.

3. The LED package of claim 1, further comprising an adhesive disposed on a surface of the stepped portion.

4. The LED package of claim 1, further comprising an adhesive disposed between the lens and the encapsulant.

5. The LED package of claim 1, wherein the pattern comprises a Fresnel pattern.

6. The LED package of claim 1, wherein the pattern comprises a pyramid pattern.

7. The LED package of claim 6, wherein the pyramid pattern comprises a matrix arrangement of quadrangular pyramids, each quadrangular pyramid comprising identical four isosceles triangular faces.

8. The LED package of claim 1, wherein the lens further comprises a phosphor.

9. The LED package of claim 1, wherein a bottom surface of the lens comprises a light incident surface in contact with the encapsulant, and a top surface of the lens comprises a light exit surface on which the pattern is disposed.

10. The LED package as in claim 1, wherein the cavity further comprises an elongated shape with a major axis and a minor axis, and the first pair of opposing inner side walls is parallel with the minor axis.

11. A backlight unit comprising a plurality of side view light emitting diode (LED) packages,
wherein at least one of the plurality of side view LED packages comprises:
a package body comprising a cavity and a stepped portion extending from a top surface of the package body and into the cavity,
an LED chip disposed on a bottom surface of the cavity,
an encapsulant disposed in the cavity and covering the LED chip, and
a lens comprising a pattern and being disposed on the stepped portion and the encapsulant,
wherein the pattern adjusts an orientation angle of light emitted from the LED chip,
wherein a top surface of the lens is disposed coplanar with or below the top surface of the package body, and
wherein the cavity comprises a first pair of opposing inner side walls, a second pair of opposing inner side walls, and the bottom surface, and wherein the stepped portion is formed on the first pair of opposing inner side walls, and the stepped portion is at least partially omitted from the second pair of opposing inner side walls.

* * * * *